(12) United States Patent
Cheng et al.

(10) Patent No.: US 8,248,091 B2
(45) Date of Patent: Aug. 21, 2012

(54) UNIVERSAL ARRAY TYPE PROBE CARD DESIGN FOR SEMICONDUCTOR DEVICE TESTING

(75) Inventors: Hsu Ming Cheng, Hsin-chu (TW); Yung-Liang Kuo, Hsin-Chu (TW); Pi-Huang Lee, Hsinchu (TW); Ann Luh, Hsinchu (TW); Frank Hwang, Hsin-Chu (TW); Wen-Hung Wu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 359 days.

(21) Appl. No.: 11/551,558

(22) Filed: Oct. 20, 2006

(65) Prior Publication Data

US 2008/0094093 A1   Apr. 24, 2008

(51) Int. Cl.
*G01R 31/20* (2006.01)
*G01R 31/02* (2006.01)

(52) U.S. Cl. .................. 324/754.07; 324/762.01

(58) Field of Classification Search .................. 324/754, 324/761–762, 765, 158.1, 754.07–754.14; 438/14–18

See application file for complete search history.

(56) References Cited

U.S. PATENT DOCUMENTS

| | | | | |
|---|---|---|---|---|
| 5,736,850 A | * | 4/1998 | Legal | 324/754.07 |
| 5,747,994 A | * | 5/1998 | Suga | 324/750.01 |
| 5,923,178 A | | 7/1999 | Higgins et al. | |
| 6,215,320 B1 | | 4/2001 | Parrish | |
| 6,551,844 B1 | * | 4/2003 | Eldridge et al. | 438/14 |
| 6,639,420 B1 | | 10/2003 | Chen et al. | |
| 6,747,466 B2 | * | 6/2004 | Sugimoto et al. | 324/754 |
| 6,791,171 B2 | | 9/2004 | Mok et al. | |
| 6,856,155 B2 | * | 2/2005 | Tay et al. | 324/755 |

FOREIGN PATENT DOCUMENTS

TW      200624835      7/2006

OTHER PUBLICATIONS

Adachi, T. et al., "Parralel, Multi-Dut Testng In An Open Architecture Test System", IEEE International Test Conference, Nov. 8, 2005, pp. 35.1-1 to 35.1-9.

Official Action issued by the Taiwan Patent Office on Jun. 23, 2010.

* cited by examiner

*Primary Examiner* — Jermele M Hollington
(74) *Attorney, Agent, or Firm* — Duane Morris LLP

(57) ABSTRACT

A universal system for testing different semiconductor devices provides a probe head with a probe pattern that may be used to test different test patterns formed on different semiconductor devices. Each of a plurality of bumps or pads of the test pattern contacts a corresponding probe of the probe head to enable the semiconductor device to be tested. The universal probe head may additionally or alternatively include a substrate design on the probe head that provides a pattern on the substrate of the probe head that may be used in conjunction with different patterns formed on a plurality of different printed circuit boards for testing different semiconductor devices.

20 Claims, 6 Drawing Sheets

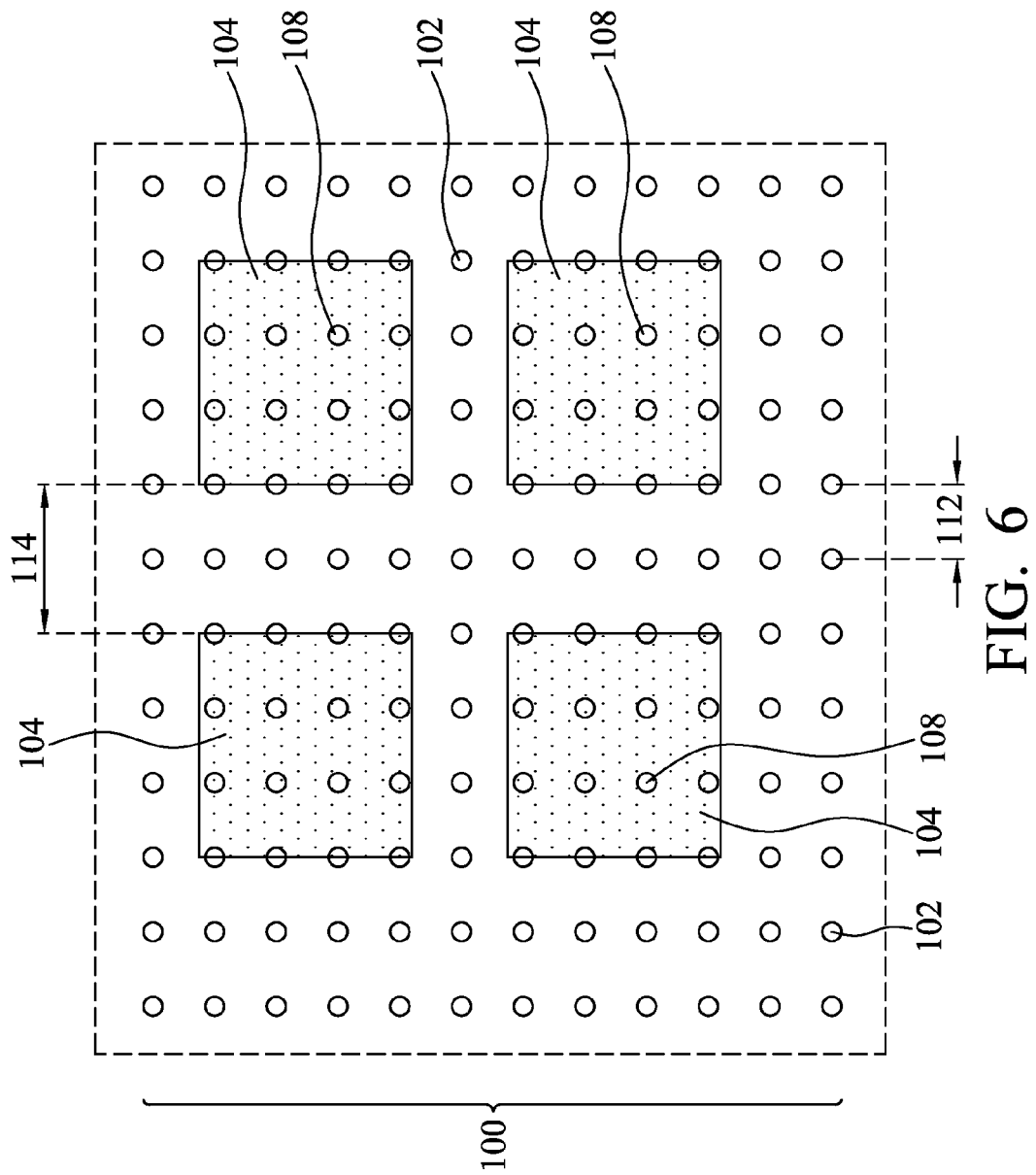

UNIVERSAL ARRAY TYPE PROBE CARD DESIGN FOR SEMICONDUCTOR DEVICE TESTING

FIELD OF THE INVENTION

The present invention relates to test probe systems for electrically testing semiconductor devices.

BACKGROUND OF THE INVENTION

Semiconductor devices are used in countless applications throughout the world and millions upon millions of individual semiconductor devices are produced annually. Each semiconductor device must be individually and completely electrically tested before it is installed within an electronic or other device. Different semiconductor devices perform different functions and therefore undergo different functional, parametric and electrical tests. In any semiconductor device fabrication or testing facility, the number of different semiconductor devices to be tested far exceeds the number of test equipment available to test the devices. As such, different semiconductor devices are tested on the same test assembly. The test assembly typically includes a probe head with probes or pins that contact the pattern formed on the semiconductor device, and a printed circuit board, PCB, dedicated to testing a particular semiconductor device. According to conventional testing technology and practices, when a new semiconductor device, i.e. a semiconductor device different than the previously tested semiconductor device, is to be tested upon a test assembly, the hardware of the probe head and also the PCB used for testing the semiconductor device, must be changed. The new test configuration must be verified before the new semiconductor device can be tested and the hardware change and verification process is a labor intensive and time consuming process.

Moreover, since each probe head and PCB is conventionally dedicated and adaptable for testing only a particular semiconductor device type, these expensive items must be purchased anew for each semiconductor device to be tested. When a semiconductor device is phased out, the costly probe head and PCB must be discarded.

Conventional probe heads are not universally adaptable for use on more than one semiconductor device or in conjunction with multiple printed circuit boards with different PCB patterns. FIG. 1 illustrates probe heads 2 and 4 that each include a pattern used to test a single corresponding semiconductor device, i.e. probe head 2 includes a probe pattern design used to test a semiconductor device having bump pattern 12 formed thereon and probe head 4 includes a probe pattern design used to test a semiconductor device having bump pattern 14 formed thereon. Bump pattern 12 consists of a plurality of bumps 13 and bump pattern 14 consists of bumps 17. It can be seen that probe head patterns 2 and 4 are the mirror images of bump patterns 12 and 14, respectively, formed on corresponding wafers 11 and 15.

It would therefore be desirable to eliminate the time consuming and labor intensive steps of changing hardware and verifying the test set up before switching to the testing of another semiconductor device, as the elimination of these shortcomings of the conventional testing procedure would enable more semiconductor devices to be tested in a given time period and produce a considerable cost savings.

SUMMARY OF THE INVENTION

To address these and other needs and in view of its purposes, the present invention provides a universal system for testing different semiconductor devices. In one aspect, the universal system comprises a test assembly including a universal probe head for electronically testing different semiconductor devices. The probe head includes probes extending therefrom and the probes form a probe pattern. The different semiconductor devices each have thereon an associated test pattern that mates with at least a portion of the probe pattern. In this manner, each of a plurality of contacts of the associated bump pattern contact a corresponding one of the probes that such each of the semiconductor devices is electronically testable on the probe head. The contacts of the test pattern may be bumps or pads.

The test assembly may further include a printed circuit board coupled to the probe head.

According to another aspect, provided is a universal system for testing semiconductor devices, the system including a test assembly including a probe head for testing different semiconductor devices. The probe head includes probes extending from a surface thereof and forming a probe pattern. The probe head further includes probe head contacts formed on an opposed surface of the probe and which form a probe head contact pattern. The different semiconductor devices are each testable using a corresponding printed circuit board, each printed circuit board having thereon an associated PCB contact pattern. The PCB contact pattern mates with at least a portion of the probe head contact pattern such that each of a plurality of PCB contacts of the associated PCB contact pattern contacts a corresponding one of the probe head contacts such that each of the semiconductor devices is testable on the probe head.

According to another aspect, the universal system includes a test assembly including a probe head for electronically testing different semiconductor devices, each tested using a corresponding and different PCB (printed circuit board). The probe assembly includes probes extending from a first side thereof and forming a probe pattern and further including a solder ball pattern formed on an opposed side thereof. The different semiconductor devices each have thereon an associated test pattern that mates with at least a portion of the probe pattern whereby each of a plurality of contacts of the associated test pattern contacts a corresponding one of the probes such that each of the semiconductor devices is electronically testable on the probe. Each of the corresponding printed circuit boards has thereon an associated PCB contact pattern alignable with at least a portion of the solder ball pattern such that each of a plurality of PCB contacts of the associated PCB contact pattern is joined to a corresponding one of the solder balls to enable each of the different semiconductor devices to be electrically tested by the probe assembly.

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

FIG. 6 is a plan view showing a universal probe head design usable to test more than one test pattern formed on a die.

DETAILED DESCRIPTION

Provided is a universal probe assembly. The probe head assembly may be usable in various electrical test assemblies, i.e., test equipment used for conducting functional, electrical and/or parametric testing of finished semiconductor devices. Test equipment with various test assemblies are available from multiple manufacturers and are commercially available. Provided is a test assembly that includes a printed circuit board, PCB, used for testing an associated semiconductor device and a probe head from which a plurality of probes extend, the probes forming a probe pattern. The probes contact a test pattern formed on a semiconductor device formed on a semiconductor wafer, to test the semiconductor wafer. The contacts of the test pattern may be bumps, pads or other suitable conductive contacts. The probe head is also coupled to the PCB via a plurality of contacts arranged in a contact pattern. According to one aspect, a universal probe pattern is provided. The universal probe pattern may be used to test various different semiconductor devices having the same or different solder ball patterns. Also provided is a probe head with a universal contact pattern that mates with a plurality of different PCB patterns for testing various different semiconductor devices.

Figure 2:
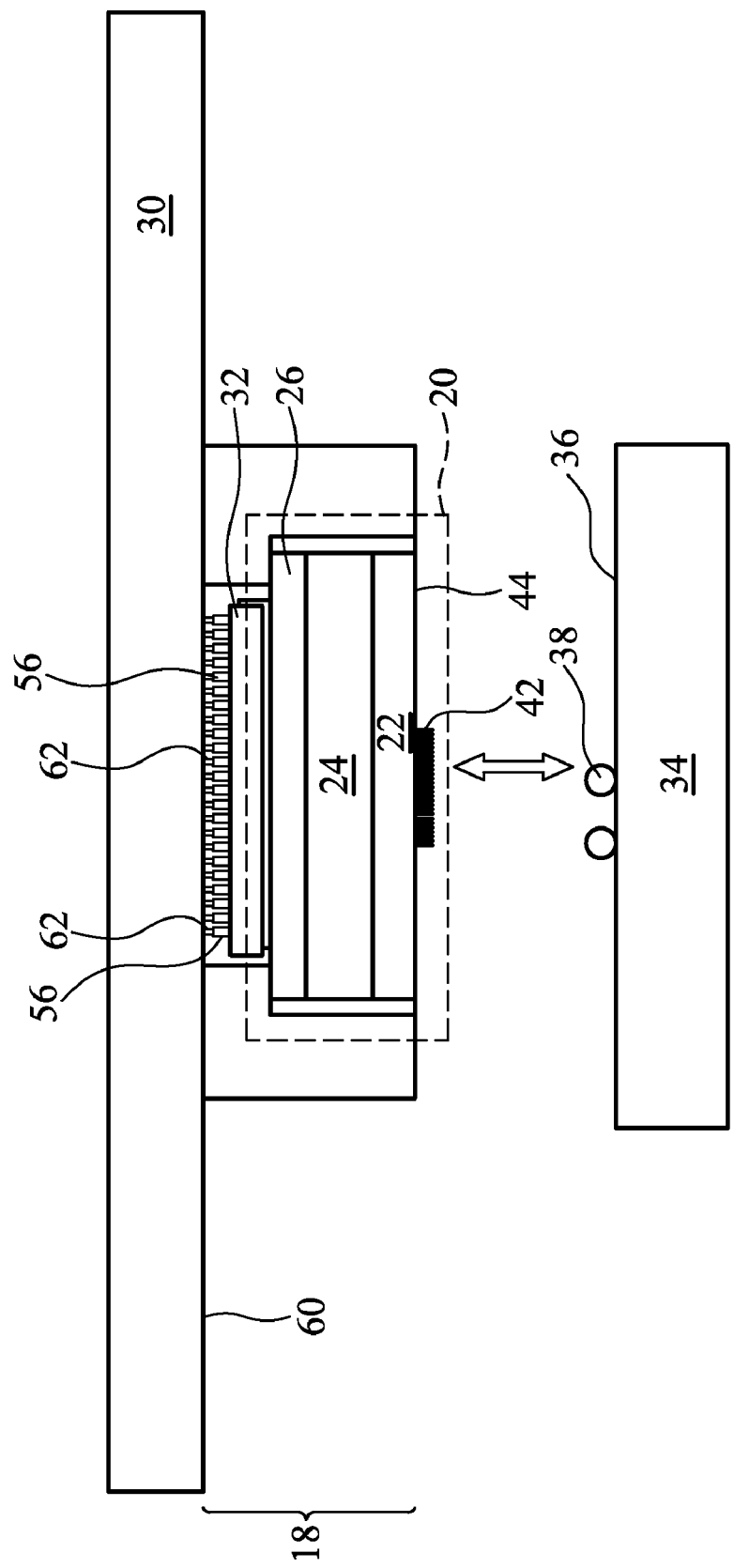
FIG. 2 is a side view showing a test assembly and corresponding wafer to be tested according to the invention.
Figure 3:
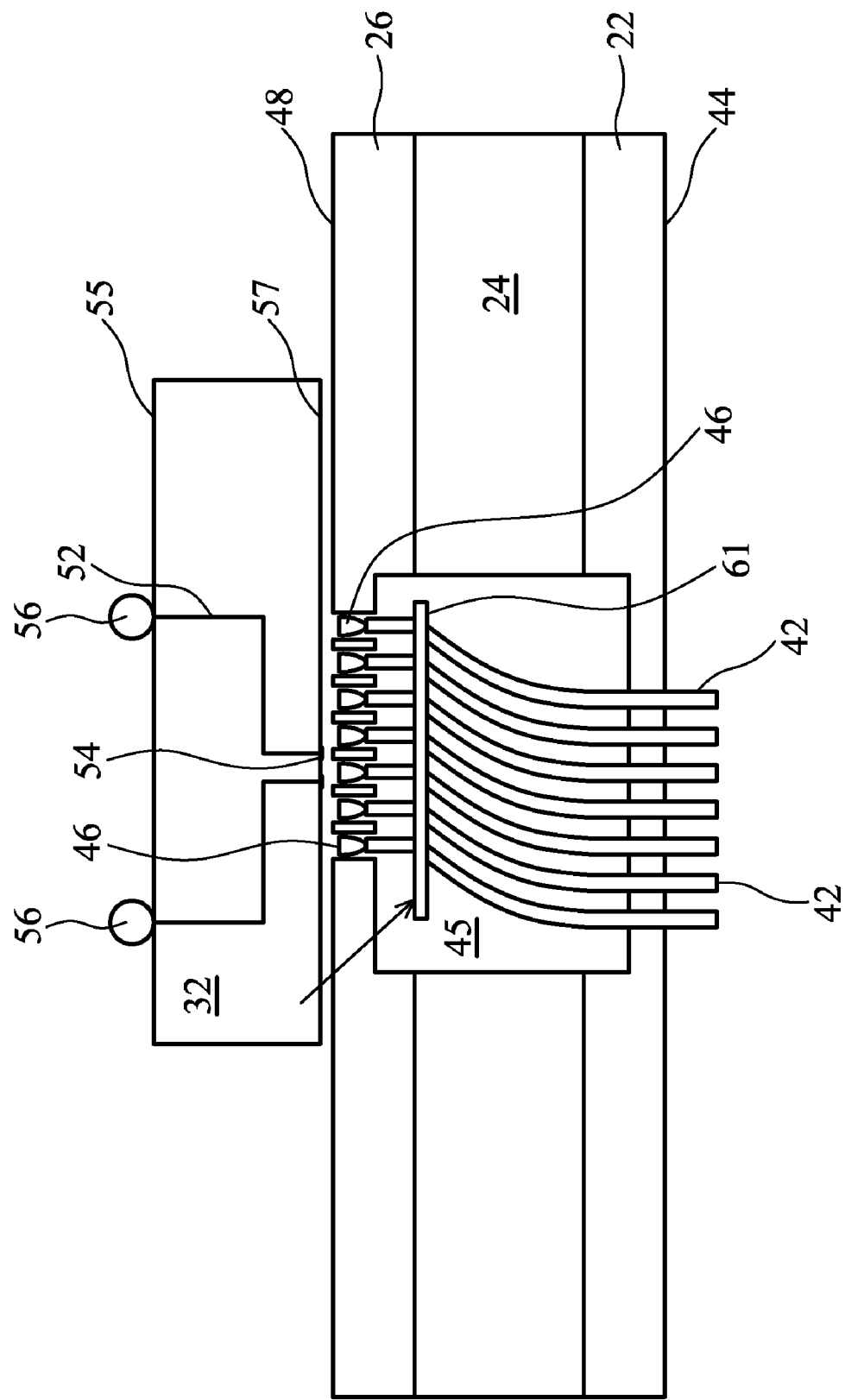
FIG. 3 is an expanded view of the probe head shown in FIG. 2.

Now referring to FIGS. 2 and 3, test assembly 18 includes probe head 20 coupled to PCB 30 via space transformer 32. FIG. 3 is a cross-sectional view of probe head 20 shown in side view in FIG. 2. Probe head 20 may alternatively be referred to as a probe card but will be referred to as a probe head hereinafter. In some exemplary embodiments, space transformer 32 may be considered to be part of probe head 20. Alternatively, space transformer 32 and probe head 20 may be considered to constitute a probe assembly. Probe head 20 is formed of lower die 22, spacer 24 and upper die 26 in the illustrated embodiment but other arrangements may be used in other exemplary embodiments. For example, more or fewer layers of material may be combined to form probe head 20. Various conventional materials may be used to form lower die 22, spacer 24 and upper die 26. Wafer 34 includes a test pattern being a pattern of bumps 38 formed on surface 36 in the illustrated embodiment. In other exemplary embodiments, the test pattern may include contacts that are bumps, pads or other suitable conductive contacts. Although wafer 34 is expanded in size relative to probe head 20, each bump 38 is coupled to a corresponding probe 42 that extends from surface 44 of probe head 20. Probes 42 form a probe pattern and probes 42 that extend from surface 44 may be resiliently retractable with respect to surface 44. Pins 46 may be coplanar with or extend from surface 48 of probe head 20 and cavity 45 and holder 61 enable the pattern formed by pins 46 on surface 48 of probe head 20, to differ from the pattern of probes 42 that extend from opposed surface 44 of probe head 20 and to correspond to the pattern of contacts 54 formed on surface 57.

When testing takes place, probe head 20 is coupled to space transformer 32 which, in turn, is coupled to PCB 30. PCB 30 includes a pattern of PCB contacts 62 on surface 60 and these PCB contacts 62 cooperate with and are coupled to a corresponding solder ball 56 formed on surface 55 of space transformer 32 as shown in FIG. 3. Internal leads or signal traces 52 within space transformer 32 enable the pattern of solder balls 56 formed on surface 55 of space transformer 32 to be different than the pattern of contacts 54 formed on opposed surface 57 of space transformer 32. Contacts 54 contact a corresponding pin 46, i.e. the pattern of contacts 54 mates with the pattern of pins 46.

The pattern of solder balls 56 on space transformer 32 mates with the pattern formed of PCB contacts 62, at least a portion of solder balls are aligned with and coupled to a corresponding solder ball 56. In one exemplary embodiment in which space transformer 32 and probe head 20 are considered a single unit, it can be seen that this single unit includes contacts on one surface, i.e. solder balls 56 on surface 55, that contact the PCB contacts 62 and probes 52 forming a probe pattern and extending from an opposed surface 44 of the single unit. The pattern of probes 42 extending from surface 44 of probe head 20 is designed to be alignable with a plurality of different bump patterns as may be formed on different semiconductor devices. In one exemplary embodiment, each solder bump of a solder bump pattern formed on a semiconductor device, contacts a corresponding probe 42 of probe head 20. In another exemplary embodiment, only a portion of the solder bumps 38 formed on a semiconductor device each contact the corresponding probe 42 of probe head 20 when the device is being tested. In one exemplary embodiment, the different semiconductor devices have corresponding different bump patterns formed thereon and in another exemplary embodiment, different semiconductor devices are formed to include the same bump pattern.

Figure 4:
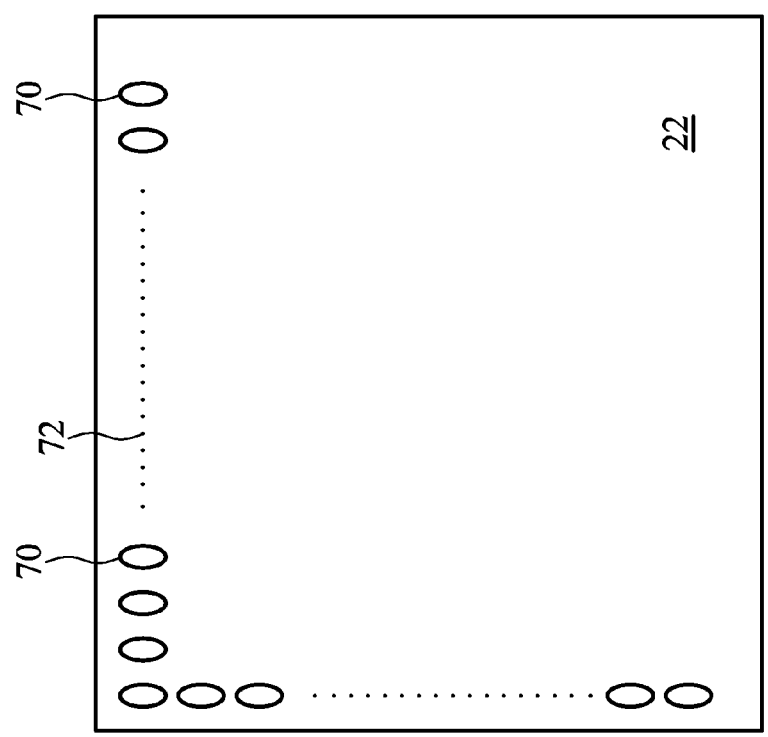
FIG. 4 is a plan view of a layer of the probe head that defines the probe pattern.

FIG. 4 is a plan view showing lower die 22 of probe head 20. Lower die 22 includes a plurality of holes 70 that extend through lower die 22 and which each receive a probe, not shown in FIG. 4, extending therethrough. Although only a few representative holes 70 are shown extending through lower die 22, the exemplary embodiment illustrated in FIG. 4 represents an 80×80 array of 6400 holes. Dots 72 represent that there is a string of 80 holes 70 along the direction indicated. The number of holes 70 and therefore the corresponding pin count of probes 42 will vary in various embodiments and may depend upon device pin count requirements for the plurality of different semiconductor devices to be tested using an exemplary probe head including a universal probe head pattern.

Figure 1:
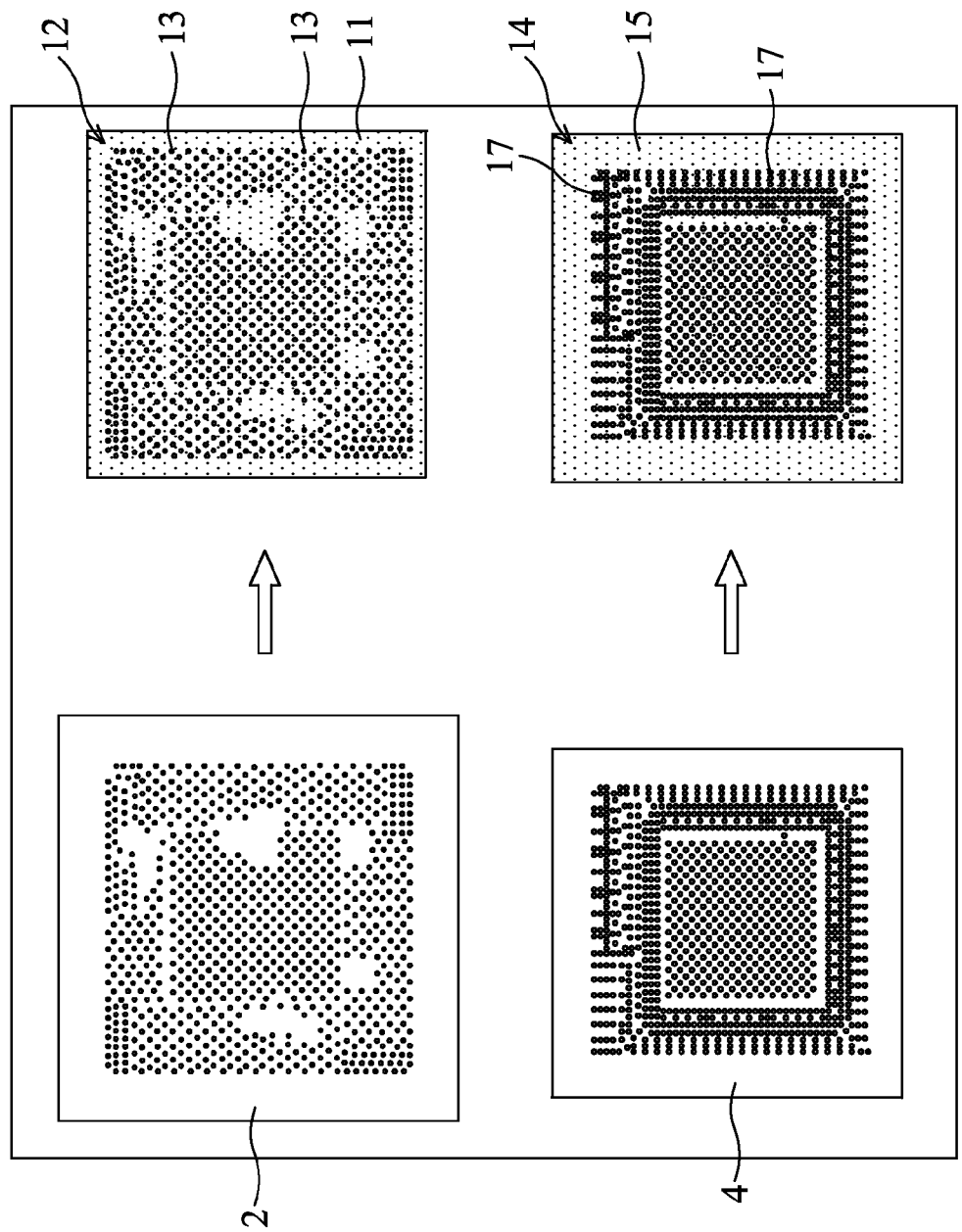
FIG. 1 shows two exemplary probe head designs according to the prior art. Each probe head design is usable only for testing a corresponding bump pattern.
Figure 5:
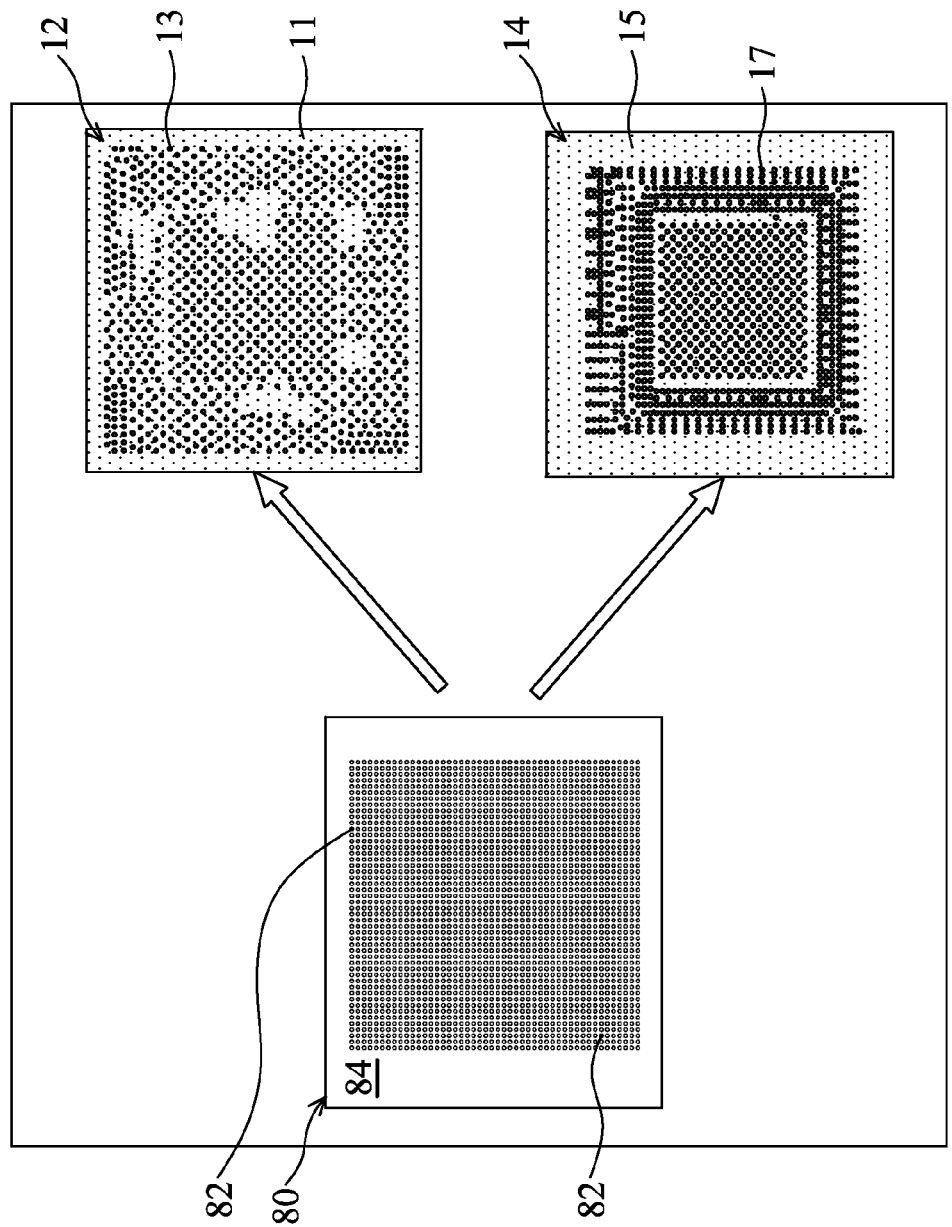
FIG. 5 shows a probe head pattern overlaid on a plurality of die being tested simultaneously.

FIG. 5 shows an exemplary probe head design with probe head 80 including a plurality of probes 82 extending from surface 84 and forming a probe pattern. Although the pattern illustrated in FIG. 5 is rectilinear with an even spacing between adjacent probes 82 in the X and Y directions, the illustrated pattern is exemplary only and other exemplary patterns may include patterns having different shapes and pitches as well as patterns with a pitch that varies throughout and with void areas included. FIG. 5 also illustrates two bump patterns 12 and 14, each previously illustrated in FIG. 1, but which now can both be tested using universal probe head 80 of the invention. Some or all of bumps 13 of bump pattern 12 will contact a corresponding probe 82 when probe head 80 contacts or is in proximate confronting relation with wafer 11 upon which bump pattern 12 is formed. In other words, a plurality of the bumps 13 will contact a corresponding probe 82. Similarly, some or all of bumps 17 of bump pattern 14 formed on wafer 15 will contact a corresponding probe 82 when probe head 80 is in confronting proximate relation with wafer 15. Wafer 15 and wafer 11 represent different semiconductor devices having different bump patterns 12 and 14. Each can be tested in a test assembly using probe head 80. In this manner, the pattern of probes 82 formed on probe head 80 may be considered a universal probe pattern. Each of wafers 11 and 15 include a plurality of semiconductor devices thereon, each represented by a corresponding bump pattern such as bump patterns 12 and 14.

FIG. 6 shows an embodiment in which multiple die may be simultaneously tested on a test assembly. FIG. 6 represents an overlay of an exemplary universal probe pattern 100 including probe locations 102 over a plurality of die 104 formed on the same semiconductor wafer. In regions wherein probe pattern 100 overlays one of the die 104, each probe location 102 is positioned over a corresponding bump on die 104 such that each overlap location 108 represents a probe aligned over and contacting a bump formed on die 104. It can be seen that four die 104 are simultaneously contacting and therefore testable using the probe head including probe pattern 100. Pitch 112 represents the pitch of the bumps on each die 104 and the pitch between adjacent probe contact locations 102 of probe pattern 100. Distance 114 by which die 104 are spaced apart, is a multiple of pitch 112 enabling probe pattern 100 with constant pitch 112 to test a plurality of die 104 simultaneously.

According to another aspect, provided is a correspondence between the pattern of solder balls 56 formed on surface 55 of space transformer 32 and a pattern of PCB contacts 62 formed on PCB 30. Please refer again to FIGS. 2 and 3. The same concepts such as shown in FIGS. 5 and 6 are used to enable multiple different patterns that may appear on PCB 30 to mate with a universal pattern formed of solder balls 56 on space transformer 32. Each of a plurality of PCB contacts 62 will contact a corresponding solder ball 56 of space transformer 32 when the components are engaged. The different patterns of PCB contacts 62 correspond to testing patterns for different corresponding semiconductor devices.

In another embodiment in which a universal PCB is provided, each of a plurality of corresponding solder balls 56 of space transformer 32 contacts a PCB contacts 62 when the components are engaged.

In yet another exemplary embodiment PCBs 30 may be designed such that different PCBs dedicated to testing difference semiconductor devices, include the same pattern of PCB contacts 62. Similarly, the different semiconductor devices may each include the same pattern of bumps 38 thereon.

In another exemplary embodiment, the concept of a first pattern having a plurality of contacts and being capable of mating with a plurality of different patterns having fewer contacts than the first pattern but in which each contact of the second pattern contacts a corresponding contact of the first pattern, may also be applied at the interface between space transformer 32 and probe head 20 with pins 46 and contacts 54 forming the opposed and matable patterns.

The preceding merely illustrates the principles of the invention. It will thus be appreciated that those skilled in the art will be able to devise various arrangements which, although not explicitly described or shown herein, embody the principles of the invention and are included within its spirit and scope. For example, the test pattern formed on the semiconductor wafers may consist of pads instead of bumps. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A universal system for testing different semiconductor devices, said universal system comprising:
   a test assembly including a probe head for electronically testing said different semiconductor devices, said probe head comprising a unitary member that includes at least one die and probes extending therefrom and forming a probe pattern with said probes in fixed position; and
   said different semiconductor devices each having thereon an associated test pattern that mates with at least a portion of said probe pattern whereby each of a plurality of contacts of said associated test pattern directly contacts a corresponding one of said probes such that each of said semiconductor devices is electronically testable on said probe head, said contacts comprising bumps or pads, wherein said associated test patterns differ for said different types of semiconductor devices.

2. The universal system as in claim 1, wherein each of said different semiconductor devices is in wafer form, each said wafer including thereon a plurality of first semiconductor devices of said different semiconductor devices.

3. The universal system as in claim 2, wherein more than one of said first semiconductor devices mates with said probes and is tested on said test assembly simultaneously.

4. The universal system as in claim 3, wherein each said first semiconductor device includes an associated first test pattern, said first test pattern and said probe pattern having the same pitch, said first semiconductor devices being separated from one another on said wafer by a multiple of said first pitch.

5. The universal system as in claim 1, wherein said associated test patterns include said plurality of contacts being disposed in different arrangements for said different semiconductor devices.

6. The universal system as in claim 1, wherein said probe head is a generally flat probe head from which said probes extend from a surface thereof, said probe head further including pins extending from an opposed surface thereof, said pins forming a pattern that mates with a pad pattern on a space transformer that couples said probe head to a printed circuit board.

7. The universal system as in claim 1, wherein said probe head is a generally flat probe head from which said probes extend from a surface thereof, said probe head further including pins extending from an opposed surface thereof, said pins forming a pattern that mates with a pad pattern on a first surface of a space transformer that includes a solder ball pattern on an opposed second surface thereof, said solder ball pattern alignable with each of a plurality of printed circuit board patterns formed on respective printed circuit boards used for testing a corresponding plurality of said different semiconductor devices.

8. The universal system as in claim 7, wherein said plurality of printed circuit board patterns include different printed circuit board patterns.

9. The universal system as in claim 8, wherein each of said printed circuit boards corresponds to one of said different semiconductor devices.

10. The universal system as in claim 1, wherein said test assembly includes a printed circuit board coupled to said probe head.

11. The universal system as in claim 1, wherein said unitary member that includes at least one die includes a duality of said die and further includes a spacer disposed between said duality of die.

12. A universal system for testing different semiconductor devices, said universal system comprising:
    a test assembly including a probe head for electrically testing said different semiconductor devices, each tested using a corresponding printed circuit board;
    said probe head comprising a unitary member that includes at least one die and probes extending from a first side thereof and forming a probe pattern comprising said probes in fixed position and further including a solder ball pattern formed on an opposed side thereof;
    said different semiconductor devices each having thereon an associated test pattern that mates with at least a portion of said probe pattern whereby each of a plurality of contacts of said associated test pattern directly contacts a corresponding one of said probes such that each of said semiconductor devices is electrically testable using said probe head, wherein said associated test patterns differ for said different semiconductor devices; and
    each of said corresponding printed circuit boards having thereon an associated PCB contact pattern alignable with at least a portion of said solder ball pattern such that each of a plurality of PCB contacts of said associated PCB contact pattern is joined to a corresponding one of said solder balls to enable each of said different semiconductor devices to be electrically tested by said test assembly.

13. The universal system as in claim 12, wherein said test assembly comprises said probe head coupled to a space transformer, said probes extending from a first side of said probe head, and said solder ball pattern formed on a first side said space transformer.

14. The universal system as in claim 12, wherein each said associated PCB contact pattern is the same.

15. The universal system as in claim 12, wherein corresponding printed circuit boards of said different semiconductor devices include different associated said PCB contact patterns thereon.

16. The universal system as in claim 12, wherein said associated test patterns include said plurality of contacts being disposed in a different arrangements for said different semiconductor devices.

17. A universal system for testing different semiconductor devices, said universal system comprising:
    a test assembly including a probe head for testing said different semiconductor devices wherein said different semiconductor devices include thereon different associated test patterns that differ for said different semiconductor devices and each said test pattern includes a plurality of contacts, said probe head comprising a unitary member that includes a duality of die with a spacer therebetween and probes extending from a surface thereof and forming a fixed probe pattern and probe head contacts in fixed position with respect to each other and forming a probe head contact pattern formed on an opposed surface thereof; and
    said different semiconductor devices each being testable using a corresponding different printed circuit board, each said different printed circuit board having thereon an associated PCB contact pattern that mates with at least a portion of said probe head contact pattern such that each of a plurality of PCB contacts of said associated PCB contact pattern, contacts a corresponding one of said probe head contacts such that each of said semiconductor devices is testable on said probe head by at least some of said plurality of contacts directly contacting a corresponding one of said probes.

18. The universal system as in claim 17, wherein each said probe head contact comprises a solder ball.

19. The universal system as in claim 17, wherein said probe head comprises a space transformer having a first surface in confronting relationship with a first surface of a probe head substrate and electrically coupled thereto, said solder balls formed on a second surface of said space transformer opposite said first surface thereof, and said probes formed on a second surface of said probe head substrate opposite said first surface thereof.

20. The universal system as in claim 17, wherein said associated test patterns include said plurality of contacts being disposed in a different arrangements for said different semiconductor devices.

* * * * *

UNITED STATES PATENT AND TRADEMARK OFFICE
CERTIFICATE OF CORRECTION

PATENT NO. : 8,248,091 B2
APPLICATION NO. : 11/551558
DATED : August 21, 2012
INVENTOR(S) : Ming-Cheng Hsu et al.

Page 1 of 1

It is certified that error appears in the above-identified patent and that said Letters Patent is hereby corrected as shown below:

On the Title page, Item (75) Inventors - First inventor's name is listed incorrectly as Hsu Ming Cheng. The correct listing is Ming-Cheng Hsu.

Signed and Sealed this
Twelfth Day of February, 2013

Teresa Stanek Rea
*Acting Director of the United States Patent and Trademark Office*